(12) United States Patent
Jung (10) Patent No.: US 8,581,365 B2
(45) Date of Patent: Nov. 12, 2013

(54) BIPOLAR JUNCTION TRANSISTOR WITH LAYOUT CONTROLLED BASE AND ASSOCIATED METHODS OF MANUFACTURING

(75) Inventor: Jeesung Jung, Campbell, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 67 days.

(21) Appl. No.: 13/092,699

(22) Filed: Apr. 22, 2011

(65) Prior Publication Data

US 2012/0267764 A1   Oct. 25, 2012

(51) Int. Cl.
*H01L 29/66* (2006.01)

(52) U.S. Cl.
USPC ....... 257/559; 257/566; 257/653; 257/E21.35

(58) Field of Classification Search
USPC ................. 257/205, 511, 526, 553, 559, 611, 257/E21.35, E21.372, E21.38, E21.382
See application file for complete search history.

(56) References Cited

U.S. PATENT DOCUMENTS

2005/0148135 A1* 7/2005 Nam et al. .................... 438/203
2006/0131693 A1* 6/2006 Kim .............................. 257/565

* cited by examiner

*Primary Examiner* — Cheung Lee
(74) *Attorney, Agent, or Firm* — Perkins Coie LLP (57) ABSTRACT

The present technology discloses a bipolar junction transistor (BJT) device integrated into a semiconductor substrate. The BJT device comprises a collector, a base and an emitter. The collector is of a first doping type on the substrate; the base is of a second doping type in the collector from the top surface of the semiconductor device and the base has a base depth; and the emitter is of a first doping type in the base from the top surface of the semiconductor device. The base depth is controlled by adjusting a layout width in forming the base.

2 Claims, 13 Drawing Sheets

BIPOLAR JUNCTION TRANSISTOR WITH LAYOUT CONTROLLED BASE AND ASSOCIATED METHODS OF MANUFACTURING

TECHNICAL FIELD

The present technology generally relates to semiconductor devices, and more particularly relates to bipolar junction transistor ("BJT") devices.

BACKGROUND

Figure 1:
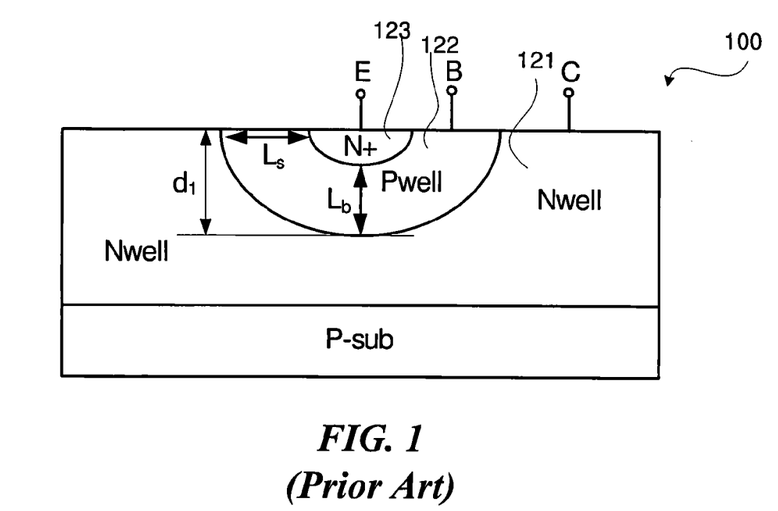
FIGS. 1 shows a BJT device in accordance with the prior art.

A BJT is a three-terminal electronic device constructed of two P-N junctions and may be used in amplifying or switching applications. Bipolar transistors are so named because their operation involves both electrons and holes. FIG. 1 shows an N-P-N BJT device 100 in accordance with the prior art. The BJT device 100 has three terminals: a collector C, a base B and an emitter E. Accordingly, the N-type BJT device 100 comprises an Nwell collector region 121, a Pwell base region 122 and a highly doped N-type emitter region 123. The base region 122 is located between the collector region 121 and the emitter region 123 and is surrounded by the collector region 121 making it almost impossible for the electrons injected into the base region 122 to escape being collected, thus giving the transistor a large gain.

In operation, the collector-emitter current $I_{CE}$ has a predetermined relationship with the base-emitter current $I_{BE}$. In other words, $I_{CE}$ is controlled by $I_{BE}$ or controlled by the base-emitter voltage $V_{BE}$. The proportion of $I_{CE}$ to $I_{BE}$ is generally referred to as the gain of the BJT device. Also, the BJT device 100 can have a breakdown voltage generally referred to as the collector-emitter breakdown voltage $BV_{CEO}$ when voltage is applied between the collector and the emitter with the base in open status. The breakdown voltage may also refer to the collector-base breakdown voltage $BV_{CBO}$ when a voltage is applied between the collector and the base with the emitter in open status.

It is believed that both the gain and the breakdown voltages are closely related to the vertical base width $L_b$, and to the lateral base width $L_s$. Since the control of the base width $L_s$ laterally near the surface can be limited by the lithography technique, and due to the surface roughness, the bulk current path is preferred and $L_b$ is controlled according to applications' requirements. At a given base doping concentration, when the vertical base width $L_b$ is wide, the breakdown voltage is high and the gain is low. In practical applications, the vertical base width $L_b$ needs to be controlled according to the specific requirements on the gain and/or the breakdown voltage. When the emitter region 123 has a predetermined size, the vertical base width $L_b$ is believed to be determined by the base depth $d_1$ of the base region 122.

For conventional well implantation approaches, the implanted well depth is controlled by precisely controlling the implantation conditions including controlling the ion-implantation dosage, energy, tilt and thermal annealing recipes. Since a different implantation condition is usually executed by applying an extra mask, additional mask is usually required for different well depths. Thus, if multiple BJT devices are integrated in a single semiconductor substrate with different parameters, or multiple Pwells or Nwells are fabricated in a semiconductor substrate requiring different implantation depths, multiple masks are required to define the specific depths. The multiple masks can add to the cost of manufacturing the semiconductor die. In addition, when the recipes for forming the BJT device including the Pwell, Pbase or Xbase are changed to improve the performances of other devices, the performance of a BJT device is also affected. Thus, extra mask(s) may be needed to prevent the performance of the BJT device being changed which further increases the cost of manufacturing.

DETAILED DESCRIPTION

Various embodiments of semiconductor devices comprising BJT devices and processes of manufacturing are described below. For example, in one embodiment, a semiconductor device comprises a BJT device integrated into a substrate. The BJT device comprises a collector, a base, and an emitter. The collector is of a first doping type and is formed on the substrate. The base is of a second doping type and is formed in the collector from the top surface of the semiconductor device, and the base has a base depth. The emitter is of a first doping type and is formed in the base from the top surface of the semiconductor device. The base depth is controlled by adjusting a layout width in forming the base. Many of the details, dimensions, angles, shapes, and other features shown in the figures are merely illustrative of particular embodiments of the technology. A person skilled in the relevant art will also understand that the technology may have additional embodiments, and that the technology may be practiced without several of the details of the embodiments described below with reference to FIGS. 2-7E.

In the description of the present application, A having a "positive relationship" with B means that when B increases, A increases accordingly, or when B decreases, A also decreases, and vice versa. A having a "negative relationship" with B means that A and B are in trade-off relationship, and when B increases, A decreases accordingly or when B decreases, A increases accordingly.

Figure 2:
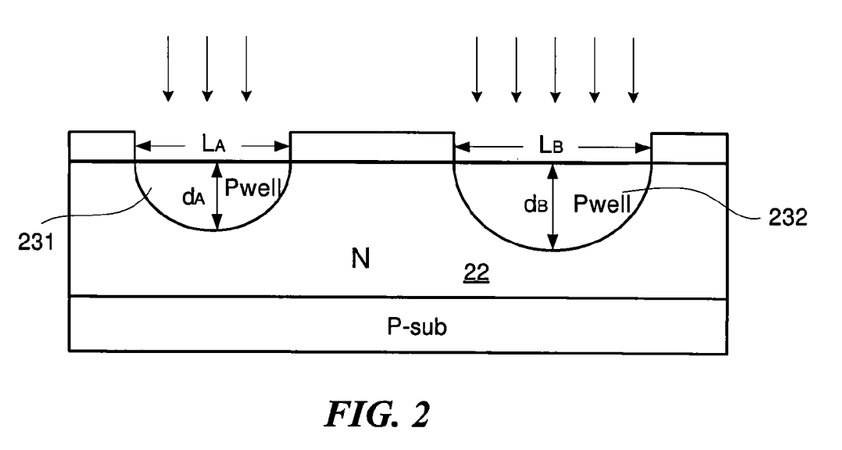
FIG. 2 is a cross-sectional view of a semiconductor device illustrating a phenomenon during well formation in accordance with embodiments of the technology.

FIG. 2 is a cross-sectional view of a semiconductor device illustrating a phenomenon during well formation in accordance with embodiments of the technology. During well formation, under certain implantation conditions, such as given certain ion-implantation dosage, energy, tilt and thermal annealing conditions, the final depth of the implanted well has a positive relationship with the layout width of the well. That is, in the formation of the well, when the mask opening increases laterally, the implantation depth also increases.

Referring to FIG. 2, two Pwells 231 and 232 are formed under the same implantation conditions in the Nwell 22. The Pwell 231 is formed with a mask opening width of $L_A$ and the Pwell 232 is formed with a mask opening width of $L_B$ and $L_A$ is narrower than $L_B$. Accordingly, the implantation depth $d_A$ is shallower than the depth $d_B$. With this characteristic, the desired vertical base width of a BJT device can be controlled by adjusting the lateral layout width of its base region.

Figure 3:
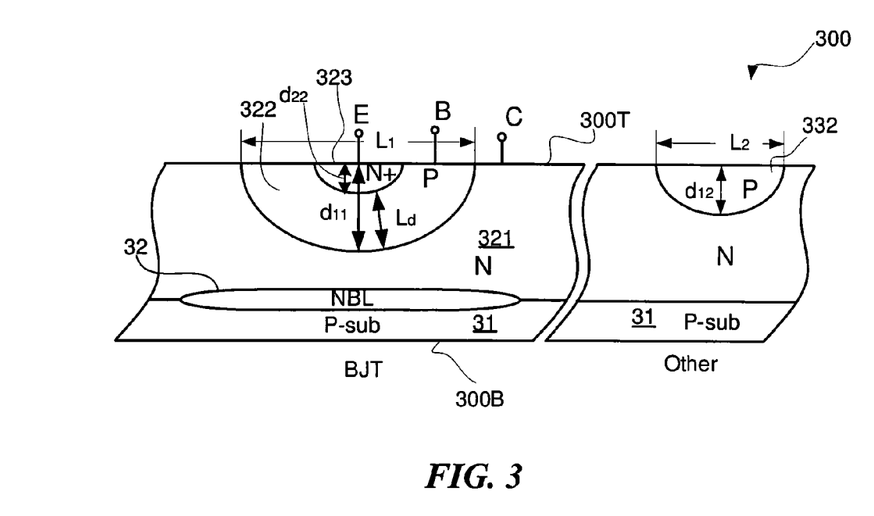
FIG. 3 shows a cross-sectional view of a semiconductor device comprising a BJT device according to one embodiment of the present technology.

FIG. 3 shows a cross-sectional view of part of a semiconductor device 300 according to one embodiment of the present technology. The semiconductor device 300 comprises a BJT region where a BJT device is fabricated. The semiconductor device 300 further comprises other regions in which other semiconductor devices may be fabricated. As shown in FIG. 3, the semiconductor device 300 comprises a P-type substrate 31. In other embodiments, the substrate 31 may comprise another material.

In the BJT region, as shown in FIG. 3, an N-type BJT device is fabricated. The BJT device comprises an N-type collector region 321, a P-type base region 322 positioned in the collector region 321 from the top surface 300T, and a highly doped N-type emitter region 323 positioned in the base region 322 from the top surface 300T. The top surface 300T is opposite the bottom surface 300B which is the external surface of the P-substrate 31. The BJT region may further comprise an N-type buried layer (NBL) 32 under the collector region 321. The collector region 321, the base region 322 and the emitter region 323 are coupled to external circuitries through contact regions and metal contacts (not shown) to form the collector electrode C, the base electrode B, and the emitter electrode E, respectively.

The vertical base width $L_d$ without biasing ($V_{BE}=0$ and $V_{CE}=0$) is believed to affect the gain and the breakdown voltage of the BJT device 300. The breakdown voltage may refer to the collector-emitter breakdown voltage $BV_{CEO}$ defined under the condition of applying a voltage between the collector and the emitter with the base is in open status. The breakdown voltage may also refer to the collector-base breakdown voltage $BV_{CBO}$ defined under the condition of applying voltage between the collector and the base with the emitter in open status. The vertical base width $L_d$ is the width or thickness of the base region 322 between the collector region 321 and the emitter region 323 in the vertical orientation. Under certain doping concentration of the Pwell of the base region 322, the gain and the breakdown voltage of a BJT device have a predetermined relationship with its vertical base width $L_d$. It is believed that wide vertical base width $L_d$ leads to a low gain and a high breakdown voltage.

The vertical base width $L_d$ is determined by the Pwell depth $d_{11}$ (or called the depth of the base region or the base depth) and the depth $d_{22}$ of the N+ emitter region 323. Given a predetermined emitter region depth $d_{22}$, the vertical base width $L_d$ is determined by the base depth $d_{11}$. When the base region 322 has a deep base depth $d_{11}$ with high curvature, the vertical base width $L_d$ is wide accordingly. While the base depth $d_{11}$ can be adjusted by the layout width $L_1$ of the Pwell for the base region 322 as described with reference to FIG. 2, the vertical base width $L_d$ can also be adjusted by the layout width $L_1$. The layout width $L_1$ is represented as the lateral span width of the base region 322.

The other regions of the semiconductor device 300 further comprises at least one Pwell 332 at the right side part as shown in FIG. 3. The Pwell 332 in the other regions and the Pwell 322 in the BJT region are fabricated with the same mask. In one embodiment, the Pwell 332 is also a base region of another BJT device. In some other embodiments, the Pwell 332 has other functions. For example, the Pwell 332 is a gate region of an N-type JFET (Junction Field Effect Transistor). The depth of a Pwell can be adjusted by its layout width based on the phenomenon as shown in FIG. 2 wherein the depth has a positive relationship with its layout width. Accordingly, as seen in FIG. 3, the lateral span width $L_1$ of the Pwell 322 in the BJT region is longer than the lateral span width $L_2$ of the Pwell 332, while the depth $d_{11}$ of the Pwell 322 is longer than the depth $d_{12}$ of the Pwell 332. In another example, the lateral width of the base region of the BJT device is shorter than the lateral width of a Pwell in other region, and the depth of the base region of the BJT device is shallower than the depth of the Pwell in said other region.

Figure 4:
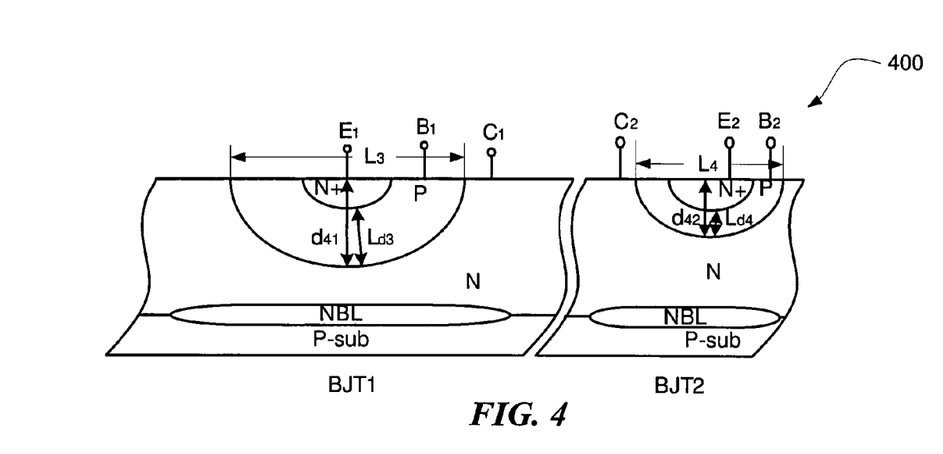
FIG. 4 is a cross-sectional view of a semiconductor device comprising a plurality of BJT devices according to one embodiment of the present technology.

FIG. 4 shows a semiconductor device 400 which comprises a plurality of BJT devices according to one embodiment of the present technology. As shown in the figure, the semiconductor device 400 comprises a first BJT device BJT1 and a second BJT device BJT2. BJT1 and BJT2 are integrated into a semiconductor substrate. Each BJT device comprises a collector ($C_1$ or $C_2$), a base ($B_1$ or $B_2$) and an emitter ($E_1$ or $E_2$). The vertical base width of a BJT device has a positive relationship with its lateral width. Thus, while the lateral span width $L_3$ of the base region of BJT1 is wider than the lateral span width $L_4$ of the base region of BJT2, the base depth $d_{41}$ of BJT1 is deeper than the base depth $d_{42}$ of BJT2, and the vertical base width $L_{d3}$ is wider than $L_{d4}$. Accordingly, the breakdown voltage of BJT1 is higher than the breakdown voltage of BJT2 and the gain of BJT1 is lower than the gain of BJT2. The above embodiments relate to N-type BJT device, however, other embodiments of the technology may be directed to P-type BJT devices with the opposite doping types.

FIGS. 5A-5G illustrate a method of manufacturing a BJT device whose vertical base width is controlled by adjusting the layout width of its base region, according to one embodiment of the present technology. Firstly, the method includes forming an NBL layer on a substrate. Secondary, the method includes growing an N-type epitaxial layer onto the surface to form a collector region. Then a Pwell in the collector region is formed as a base region wherein the layout opening width for the Pwell is adjusted according to the vertical base width requirement and the predetermined depth of the emitter region. And finally forming an N+ emitter region in the Pwell. The method will be described in detail with reference to FIGS. 5A-5E.

Figure 5A:
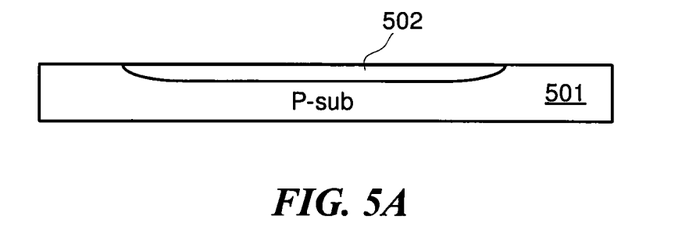
FIGS. 5A-5G illustrate a method of manufacturing a BJT device according to one embodiment of the present technology.

Referring to FIG. 5A, an NBL layer 502 is formed on a P-type substrate 501 at the BJT region such that the NBL layer 502 is under the BJT device for reducing the gain of the parasitic bipolar transistor and the collector resistance. The term "semiconductor substrate" can also refer to the combination of the P-type substrate 501 and the N-type epitaxial layer 503. In one embodiment, the substrate layer 501 is a material other than the P-type semiconductor material. If multiple BJT regions are to be fabricated on the semiconductor substrate 501, multiple NBL regions 502 may be formed. Forming of NBL layer 502 can adopt any suitable method. For not obscuring the inventive points, the details of forming an NBL layer is not described herein for clarity.

Figure 5B:
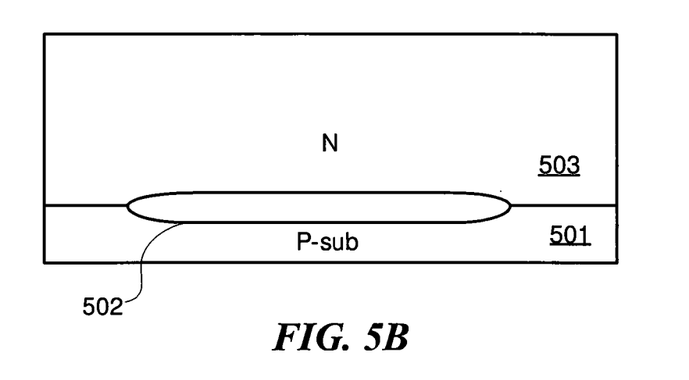

In FIG. 5B, an N-type layer 503 is formed on the surface of the substrate 501 and partly on the NBL layer 502. The N-type layer 503 forms a collector region of the BJT device. In some embodiment, the N-type layer 503 is fabricated by forming an N-type epitaxial layer on the substrate 501. And in other embodiments, the N-type layer 503 is an Nwell formed by an ion-implantation doping step. In certain embodiment, the term of "substrate" may refer to the combination of the N-type layer 503 and the original P-type substrate 501.

Figure 5C:
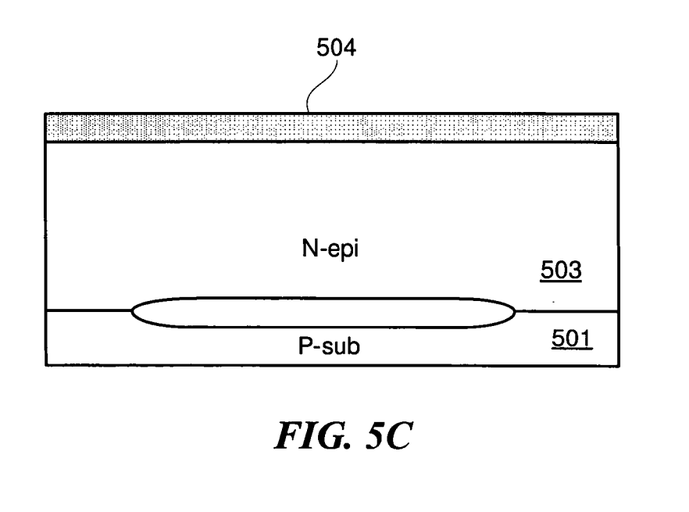
Figure 5D:
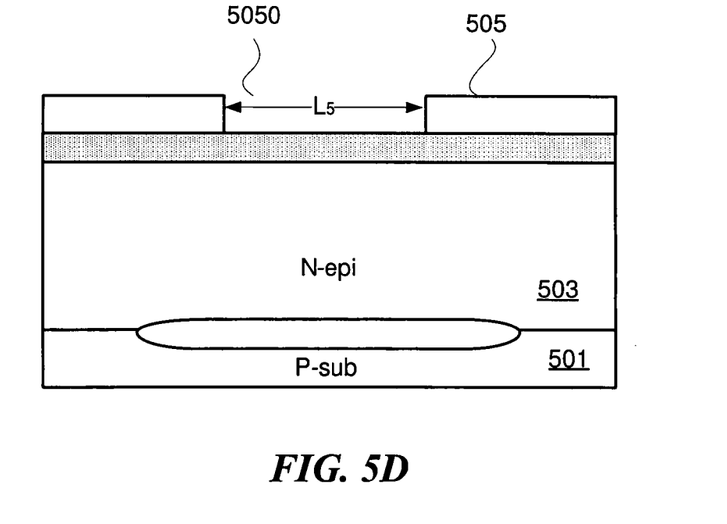
Figure 5E:
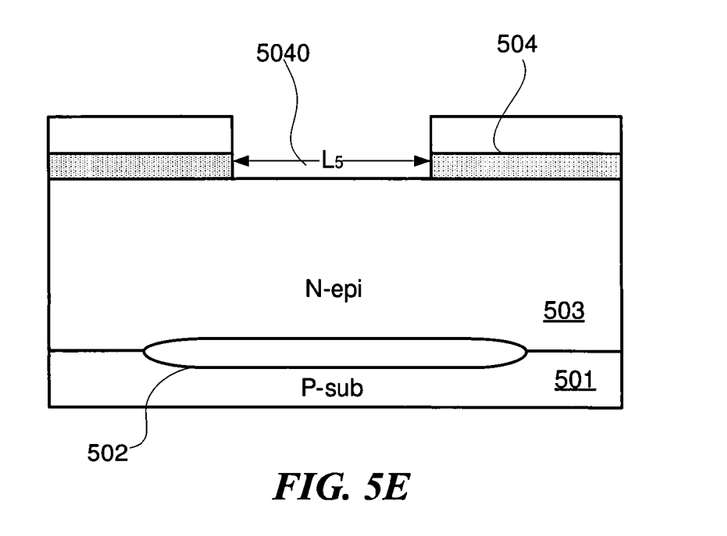

FIGS. 5C-5E refer to a photolithography process for forming a Pwell for the base region of the BJT device and controlling the depth of the Pwell. In FIG. 5C, a photoresist layer 504 is placed over the N-type epitaxial layer 503. Then in FIG. 5D, a mask 505 with an opening 5050 is placed above the photoresist layer 504. The width $L_5$ of the mask opening 5050 (or called the layout width) is calculated to meet the desired performance of the BJT device.

Under a predetermined doping concentration of the BJT device, the performance of the BJT device, such as the breakdown voltage or the gain, has a predetermined relationship with its vertical base width. When the doping concentration is changed due to other devices' requirements, the performance of the BJT device can be maintained by adjusting the vertical base width. The vertical base width of the BJT device can be controlled by the layout width of the base as discussed with reference to FIG. 2. The layout width of the base region is believed to have a positive relationship with the required breakdown voltage and have a negative relationship with the required gain of the BJT device. Thus, a BJT device of high gain requires a narrow base layout width and a BJT device of low gain can be achieved by a wide base layout width. And then in FIG. 5E the photoresist layer 504 is patterned into an opening 5040 with the same width $L_5$ as the mask opening 5050.

Figure 5F:
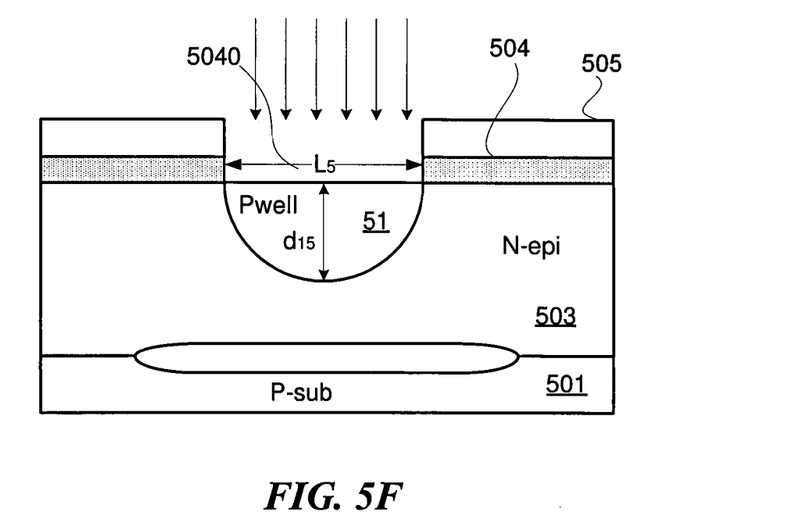

In FIG. 5F, P-type dopants are doped into the opening 5040 to form a Pwell 51 under predetermined implantation conditions, and a thermal annealing process is performed thereafter. In certain embodiments, the predetermined implantation conditions are used also to form other Pwell or Pwells. The predetermined implantation conditions include but are not confined to predetermined implantation dosage, energy and tilt. As described with reference to FIG. 2, the depth $d_{15}$ of the Pwell 51 has a positive relationship with its lateral width $L_5$.

Figure 5G:
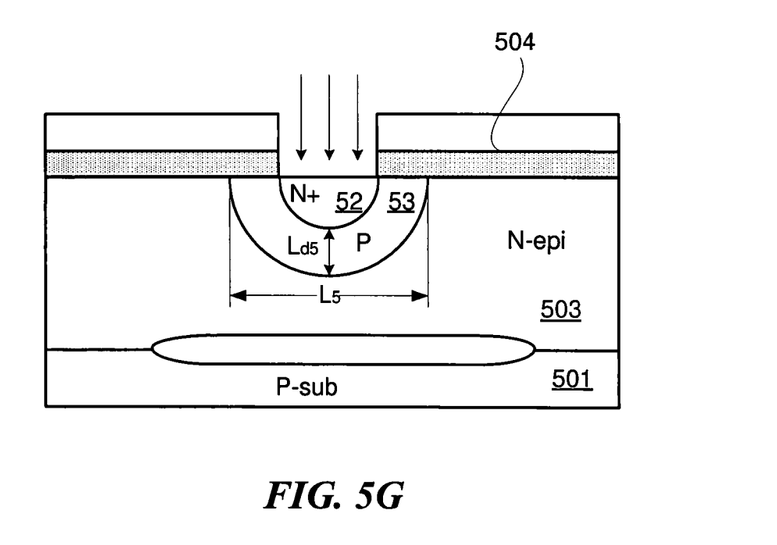

As shown in FIG. 5G, a photolithography process and implantation are performed to form the N+ emitter region 52 in the Pwell 51 from the top surface. And the base region 53 is defined by the Pwell 51 and the emitter region 52. Since the base depth d15 has a positive relationship with the layout width $L_5$, for a predetermined depth of the emitter region 52, the vertical base width $L_{d5}$ can also be controlled by layout width $L_5$ and can have a positive relationship with layout width $L_5$. Further processing operations can be performed to finalize the BJT device. For example, forming contact regions for the collector terminal, the base terminal, and the emitter terminal, and/or other suitable processing operations.

Figure 6A:
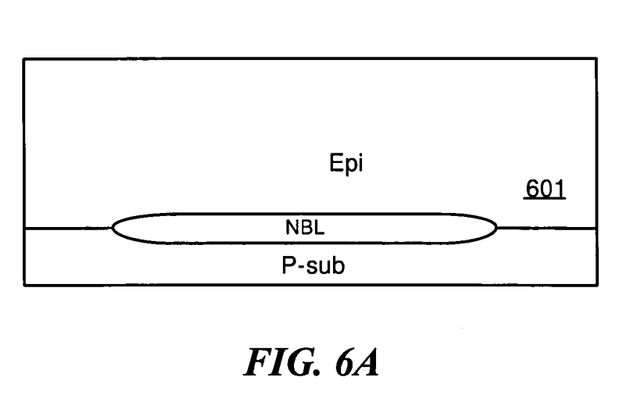
FIGS. 6A-6I illustrate another method of manufacturing a BJT device according to one embodiment of the present technology.

FIGS. 6A-6I illustrate another method of manufacturing a BJT device. For this method, the Pwell 61 for the base region is manufactured before forming the Nwell for the collector region while the Nwell for the collector region is manufactured using a Pwell oxide layer as a mask. In one embodiment, the NBL layer can be formed generally similarly as described with reference to FIG. 5A. As shown in FIG. 6A, forming an epitaxial layer 601 is performed, but Nwell formation are performed in later operations.

Figure 6B:
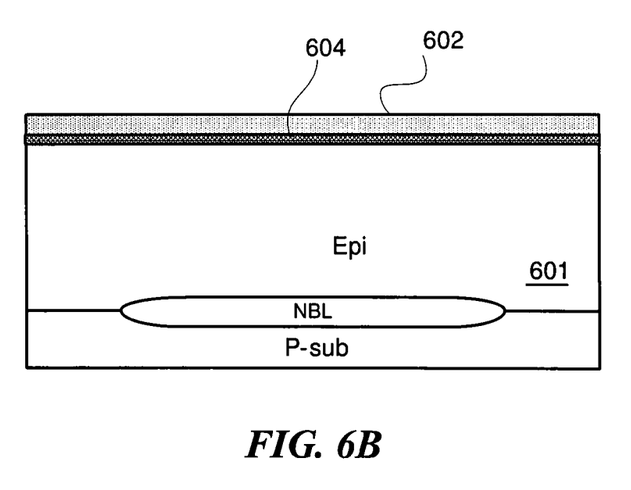

And then in FIG. 6B, a passivation layer 604 comprising an oxide layer and a nitride layer atop the oxide layer is grown on the epitaxial layer 601. The passivation layer 604 can be formed by any suitable techniques such as chemical vapor deposition (CVD). Then a photoresist layer 602 is placed onto the passivation layer 604.

Figure 6C:
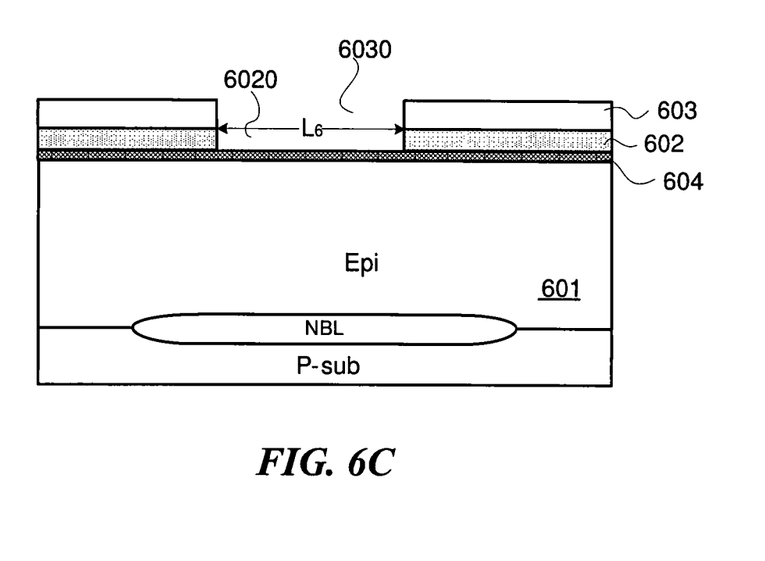

FIG. 6C shows a photolithography technique illustrating a process flow generally similar as shown in FIGS. 5C-5E. First a mask 603 with an opening 6030 is placed onto the photoresist layer 602. The width $L_6$ of the mask opening 6030 is calculated based on the required performance of the BJT device or the vertical base width of the BJT device which has a positive relationship with the layout width $L_6$. If higher gain is desired, the width $L_6$ is adjusted narrower and to get a narrower vertical base width. If higher breakdown voltage is desired, the width $L_6$ is adjusted wider to get a wide vertical base width. Then the photoresist layer 602 is patterned into the base opening 6020 with the same layout width $L_6$.

Figure 6D:
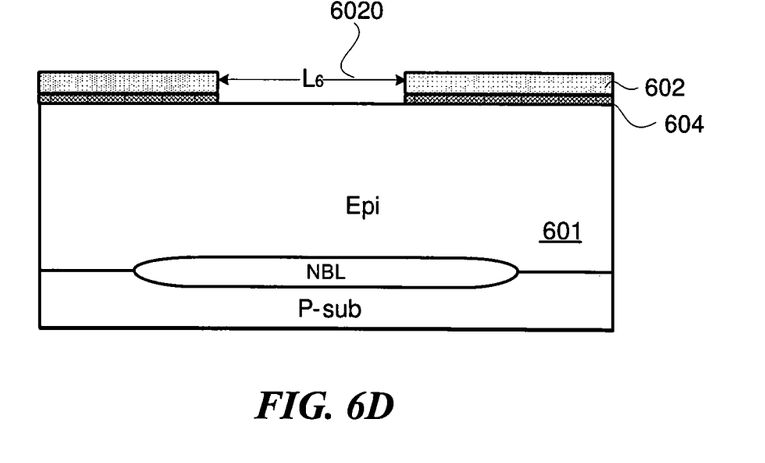

As shown in FIG. 6D, the passivation layer 604 is etched through the base opening 6020 and the surface of the epitaxial layer 601 is exposed with a width of $L_6$. The etching of the passivation layer 604 can include any suitable technique such as plasma etching. Then the photoresist layer 602 is removed. The passivation layer 604 functions as a hard mask for forming an Nwell as the collector region of the BJT device.

Figure 6E:
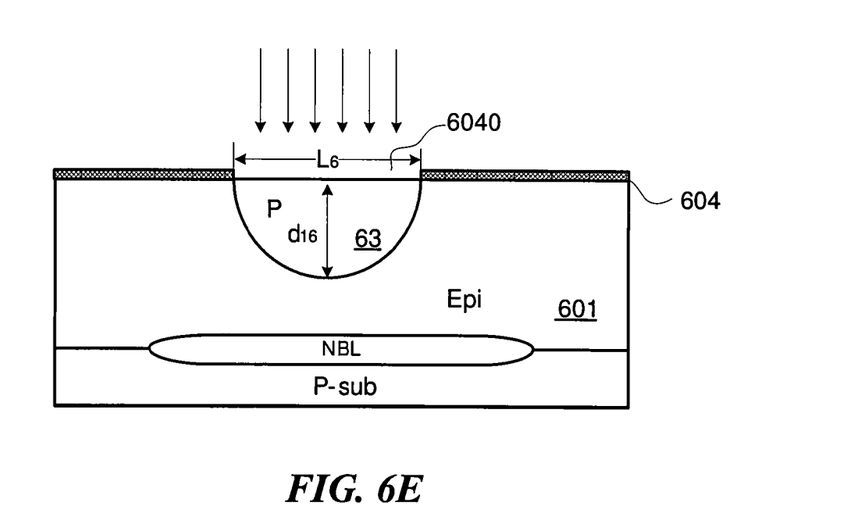
Figure 6F:
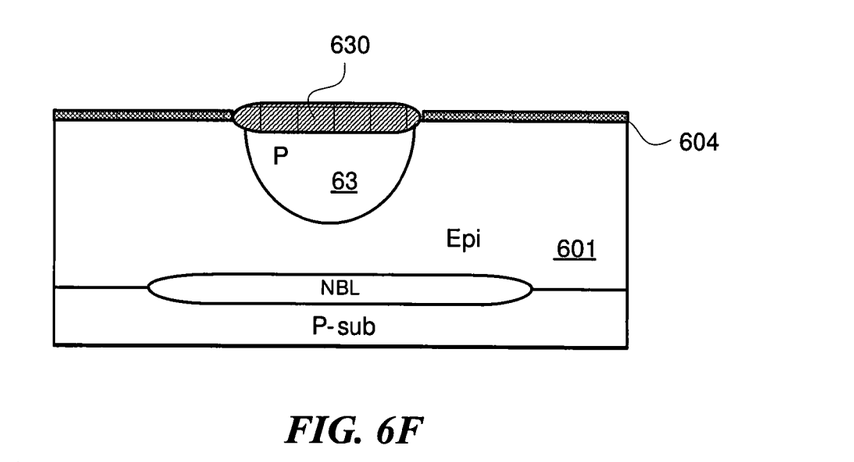

In FIG. 6E, P-type dopants are implanted into the opening 6040 of the passivation layer 604 to form the Pwell 63. Under the predetermined implantation conditions including the predetermined ion-implantation dosage, energy, tilt and thermal annealing conditions, the base depth $d_{16}$ has a predetermined positive relationship with its width $L_6$. Then in FIG. 6F, a Pwell oxidation process is performed in window 6040 of the passivation layer 604 and a Pwell oxide layer 630 is grown on the surface of the Pwell 63.

Figure 6G:
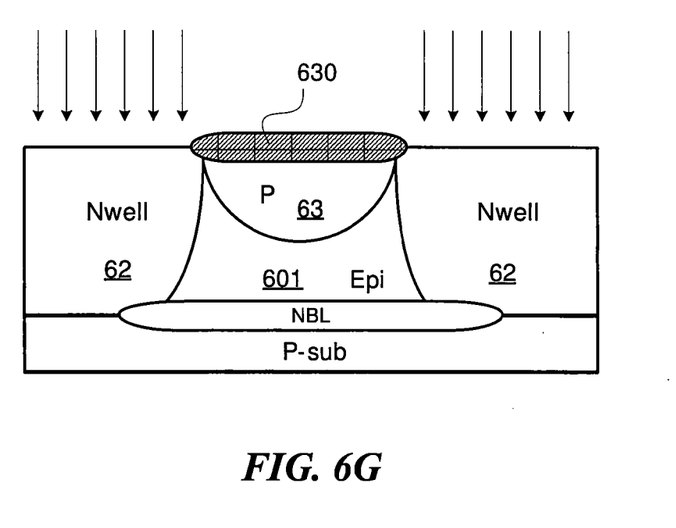

In FIG. 6G, the Pwell oxide layer 630 serves as the blocking mask for forming an Nwell 62 and N-type dopants such as phosphorous are implanted and self-aligned to the edge of the Pwell oxide layer 630. After Nwell implantation, the Pwell oxide layer 630 is removed. Though the Nwell 62 is shown as separate parts in FIG. 6G, the Nwell 62 may be connected as a whole as a single well from the top plane view.

Figure 6H:
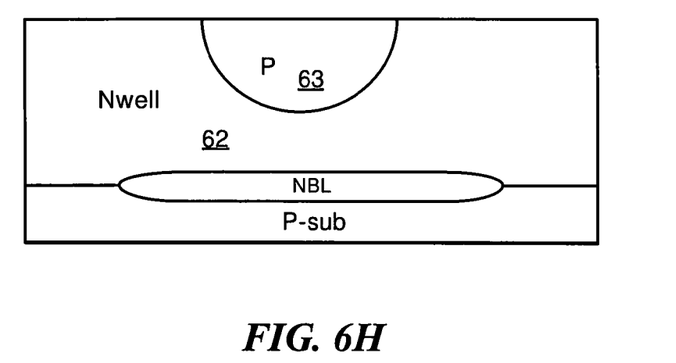
Figure 6I:
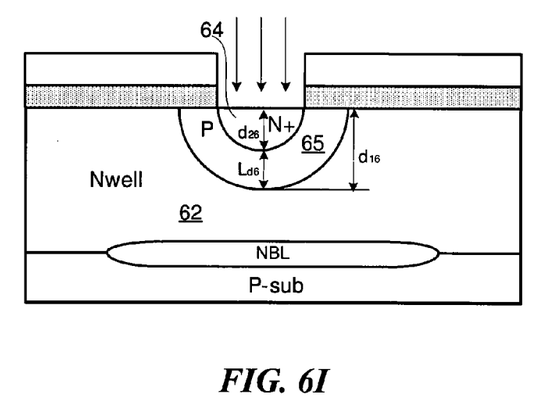

As shown in FIG. 6H, the Nwell 62 is driven in with predetermined thermal conditions to side diffuse under the Pwell 63 and the Nwell 62 forms the collector region of the BJT device. In FIG. 6I, a photolithography process is performed to form the N+ emitter region 64 in the Pwell 63 from the top surface. And the base region 65 is defined by the Pwell 63 and the emitter region 64. The vertical base width $L_{d6}$ is determined by the depth $d_{16}$ of the Pwell 63 and the depth $d_{26}$ of the emitter region 64. When $d_{26}$ is a predetermined depth, the vertical base width $L_{d6}$ is determined by the base depth $d_{16}$ and can be controlled by adjusting the layout width $L_6$ of the Pwell 63, and accordingly the performance of the BJT device is adjusted by varying $L_6$ either.

The vertical base width of the BJT device is controlled by adjusting a layout width in the step of forming its base region in the methods shown in FIGS. 5A-5G and FIGS. 6A-6I. Thus when the BJT device is integrated with other circuits or components in a semiconductor substrate, the particular vertical base width of the BJT device does not require additional masks. The embodiments shown in FIGS. 5A-5G and FIGS. 6A-6I are only for illustration only, and some well-known operations and components are omitted for clarity.

The methods described above control the base depth by adjusting the layout width of the base region. Yet in another method, the base depth of an NPN BJT device can be controlled by adjusting the layout of an Nwell which is a counter-part of a Pwell for the base region. And the base depth of a P-type BJT device can be controlled by adjusting the layout of a Pwell which is a counter-part of an Nwell for the base region.

Figure 7A:
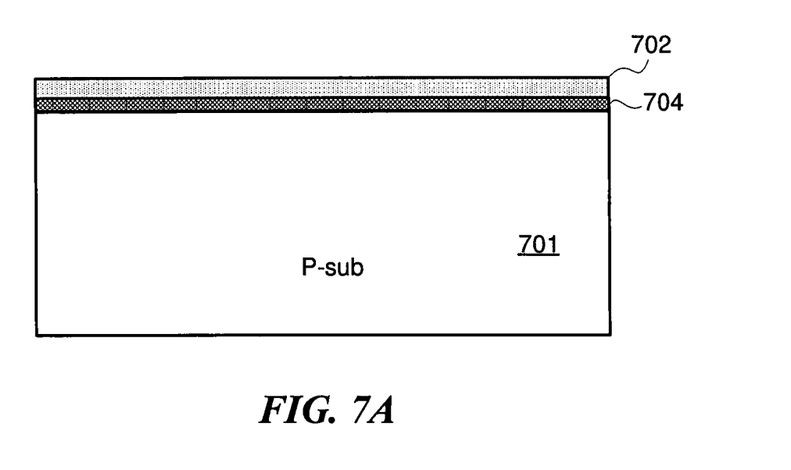
FIGS. 7A-7E illustrate a method of manufacturing an N-type BJT device having a base width adjusted according to a layout width in forming an Nwell according to one embodiment of the present technology.

FIGS. 7A-7E illustrate a method of forming an N-type BJT device where the base depth is controlled by adjusting a layout width in forming an Nwell, according to one embodiment of the present technology. As shown in FIG. 7A, the method includes forming a passivation layer 704 on a substrate 701. The passivation layer 704 may comprise an oxide layer on the substrate 701 and a nitride layer atop the oxide layer. A photoresist layer 702 is placed on the passivation layer 704. The substrate 701 may further comprise an original semiconductor substrate, an N+ buried layer at the BJT region on the original semiconductor substrate, and an epitaxial layer on the original semiconductor substrate and the buried layer.

Figure 7B:
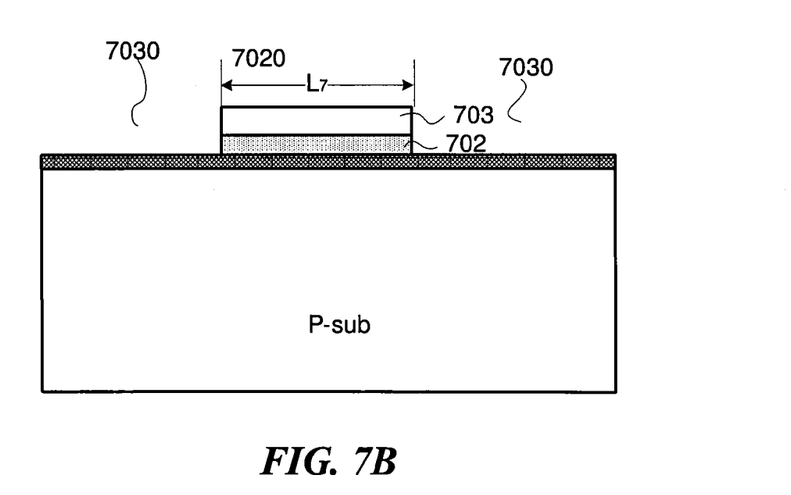

In FIG. 7B, a photolithography process is illustrated. A mask 703 with mask openings 7030 is placed onto the photoresist layer 702, then the photoresist layer 702 is patterned. Though the mask openings 7030 are shown with separated parts, they may be connected from the top plane view as a whole in other regions. It should be noted that this sectional view only shows part of a semiconductor device and the shown mask openings 7030 can be illustrated as part of the mask openings. And the opening 7030 shown as separate parts in FIG. 7B is a single opening connected together from the top plane view. The mask 703 has a pattern 7020 with a width of $L_7$ as a counter-part of the openings 7030. And the width $L_7$ is named the layout space width.

Figure 7C:
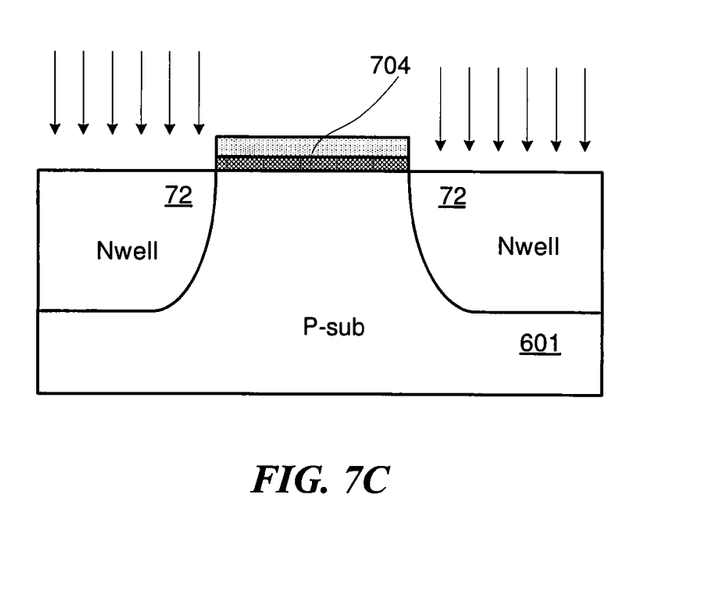
Figure 7D:
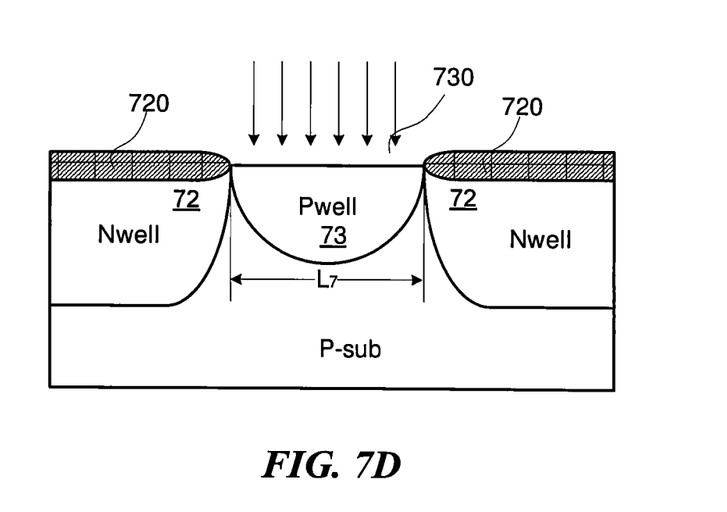

As illustrated in FIG. 7C, the passivation layer 704 is etched and patterned into openings and N-type dopants are implanted into the openings to form an Nwell (Nwells) 72. In FIG. 7D, an Nwell oxide layer 720 is grown on the surface of the Nwell (Nwells) 72. The Nwell oxide layer 720 serves as a blocking mask and P-type dopants are implanted into the opening 730 to form a Pwell for the base region 73. The depth of the Pwell 73 has a positive relationship with the width of the opening 730. The opening 730 is the counter-part of the layout opening 7030 with a layout space width.

Figure 7E:
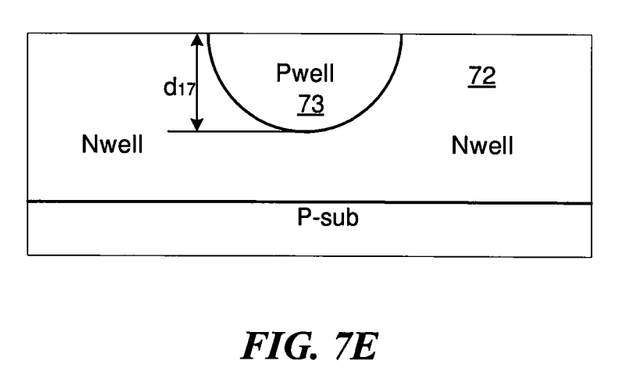

Afterwards, thermal annealing is performed and Nwells 72 are diffused laterally under the Pwell 73 and forms the collector region, as shown in FIG. 7E. Though the thermal annealing may drive in the Pwell 73, the side diffusion distance of the Pwell 73 has a predetermined value. While the base opening 730 in FIG. 7D is a counter-part of the mask openings 7030 in FIG. 7B, the base depth $d_{17}$ has a predetermined positive relationship with the width $L_7$.

The above embodiments relate to forming N-type BJT devices, however, other embodiments may involve forming P-type BJT devices with components having opposite doping type. In one embodiment, a first doping type is the N doping type and a second doping type is the P doping type. And in another embodiment, a first doping type is the P doping type and the second doping type is the N doping type. N doping type is the type that a semiconductor material is doped with either phosphor, arsenic or any other suitable material such that charge is carried by electrons, and a P doping type is the type that a semiconductor material is doped with either boron, aluminum, gallium or any other suitable material such that charge is carried by holes.

From the foregoing, it will be appreciated that specific embodiments of the technology have been described herein for purposes of illustration, but that various modifications may be made without deviating from the disclosed technology. Elements of one embodiment may be combined with other embodiments in addition to or in lieu of the elements of the other embodiments. Accordingly, the technology is not limited except as by the appended claims.

I claim:
1. A semiconductor device, comprising:
  a first bipolar junction transistor (BJT) device integrated into a semiconductor substrate, wherein the first BJT device comprises a collector, a first base, and an emitter, and wherein the collector is of a first doping type, the first base is of a second doping type, the emitter is of the first doping type;
  a second BJT device integrated into the semiconductor substrate;
  wherein the base depth has a positive relationship with the lateral span width of the base;
  the first base having a first lateral span width and a first depth;
  the second BJT device comprises a second base having a second lateral span width and a second depth;
  the first lateral span width is larger than the second lateral span width, and the first depth is larger than the second depth; and
  wherein the first BJT device has a first gain and the second BJT device has a second gain, and wherein the first gain is smaller than the second gain.

2. A semiconductor device, comprising:
  a first bipolar junction transistor (BJT) device integrated into a semiconductor substrate, wherein the first BJT device comprises a collector, a first base, and an emitter, and wherein the collector is of a first doping type, the first base is of a second doping type, the emitter is of the first doping type:
  a second BJT device integrated into the semiconductor substrate;
  wherein the base depth has a positive relationship with the lateral span width of the base;
  the first base having a first lateral span width and a first depth:
  the second BJT device comprises a second base having a second lateral span width and a second depth;
  the first lateral span width is larger than the second lateral span width, and the first depth is larger than the second depth: and
  wherein the first BJT device has a first breakdown voltage and the second BJT device has a second breakdown voltage, and wherein the first breakdown voltage is higher than the second breakdown voltage.

* * * * *